US012765101B2

(12) United States Patent
Liu et al.

(10) Patent No.: US 12,765,101 B2
(45) Date of Patent: Oct. 13, 2026

(54) FRONTSIDE DEEP TRENCH ISOLATION (FDTI) STRUCTURE FOR CMOS IMAGE SENSOR

(71) Applicant: Taiwan Semiconductor Manufacturing Company, Ltd., Hsinchu (TW)

(72) Inventors: Chao-Te Liu, Kaohsiung City (TW); Yen-Chen Lin, Taipei City (TW); Szu-Ying Chen, Miaoli County (TW); Chen-Jong Wang, Hsin-Chu (TW); Dun-Nian Yaung, Taipei City (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 564 days.

(21) Appl. No.: 18/314,184

(22) Filed: May 9, 2023

(65) Prior Publication Data

US 2024/0266375 A1 Aug. 8, 2024

Related U.S. Application Data

(60) Provisional application No. 63/482,849, filed on Feb. 2, 2023.

(51) Int. Cl.
*H10F 39/00* (2025.01)
*H10F 39/18* (2025.01)

(52) U.S. Cl.
CPC ......... *H10F 39/807* (2025.01); *H10F 39/014* (2025.01); *H10F 39/18* (2025.01)

(58) Field of Classification Search
CPC ...... H10F 39/014; H10F 39/18; H10F 39/199; H10F 39/813; H10F 39/807; H10F 39/12;
(Continued)

(56) References Cited

U.S. PATENT DOCUMENTS

2019/0096929 A1 3/2019 Chiang et al.
2019/0115388 A1* 4/2019 Jung ..................... H10F 39/151
(Continued)

FOREIGN PATENT DOCUMENTS

KR 20190037186 A 4/2019

OTHER PUBLICATIONS

Charavel, Rémy & Laconte, Jean & Raskin, Jean-Pierre. (2003). Advantages of p++ polysilicon etch stop layer versus p++ silicon. Proc SPIE. 5116. 10.1117/12.498107 (Year: 2003).*

*Primary Examiner* — Julio J Maldonado
*Assistant Examiner* — Paul A Berry
(74) *Attorney, Agent, or Firm* — Eschweiler & Potashnik, LLC

(57) ABSTRACT

In some embodiments, the present disclosure relates to a method for forming an image sensor and associated device structure. A FDTI trench is formed from a frontside of a substrate between a first pixel region and a second pixel region and then filled to form a FDTI structure. A cap layer is formed over the FDTI structure overlying the first pixel region and the second pixel region of the substrate. A first photodiode is formed in the first pixel region and a second photodiode is formed in the second pixel region. A FD node is formed within the cap layer between the first pixel region and the second pixel region overlying the FDTI structure. The FD node may be shared by a group of pixel regions not separated by the FDTI structure, such that few metal contacts are needed and thus reduce parasitic capacitance issues of proximity metal contacts.

20 Claims, 12 Drawing Sheets

(58) Field of Classification Search
CPC .... H10F 30/22; H10F 39/8053; H10F 39/802; H10F 39/80; H10F 39/8023; H10F 39/8027; H01L 21/76224; H10D 84/0188; H10W 10/014; H10W 10/0145; H10W 10/011; H10W 10/10
See application file for complete search history.

(56) References Cited

U.S. PATENT DOCUMENTS

| | | | | |
|---|---|---|---|---|
| 2020/0058686 | A1 | 2/2020 | Wu et al. | |
| 2022/0045109 | A1* | 2/2022 | Wang | H10F 39/024 |
| 2022/0285203 | A1 | 9/2022 | Chiu et al. | |
| 2022/0336514 | A1* | 10/2022 | Lim | H10F 39/805 |
| 2022/0384495 | A1 | 12/2022 | Wu et al. | |

* cited by examiner

200A

200B

FRONTSIDE DEEP TRENCH ISOLATION (FDTI) STRUCTURE FOR CMOS IMAGE SENSOR

REFERENCE TO RELATED APPLICATION

This Application claims the benefit of U.S. Provisional Application No. 63/482,849, filed on Feb. 2, 2023, the contents of which are hereby incorporated by reference in their entirety.

BACKGROUND

Many modern day electronic devices, such as digital cameras and video cameras, contain image sensors to convert optical images to digital data. An image sensor comprises an array of pixel regions, and each pixel region contains a photodiode configured to capture optical signals (e.g., light) and convert it to digital data (e.g., a digital image). Complementary metal-oxide-semiconductor (CMOS) image sensors are often used over charge-coupled device (CCD) image sensors because of their many advantages, such as lower power consumption, faster data processing, and lower manufacturing costs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
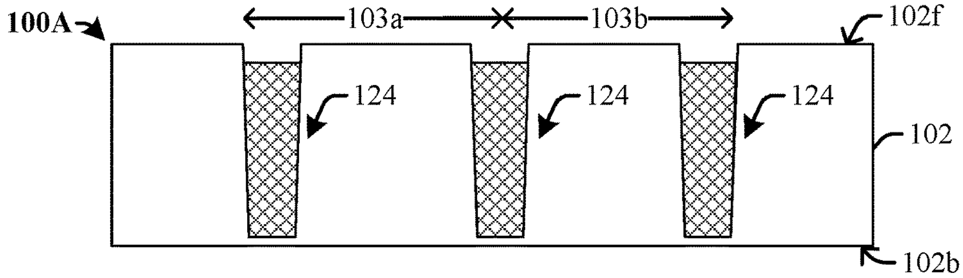
FIGS. 1A-1D illustrate a series of cross-sectional views of some embodiments of a method of forming a Frontside Deep Trench Isolation (FDTI) structure and a shared FD node overlying the FDTI structure.
Figure 1B:
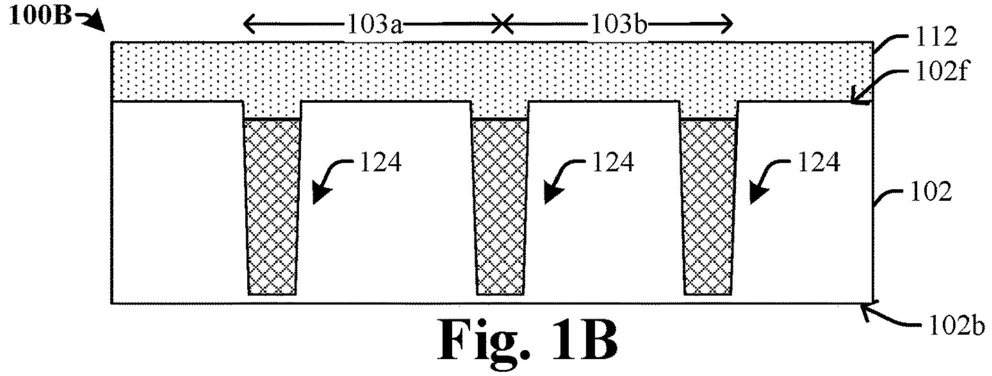
Figure 1C:
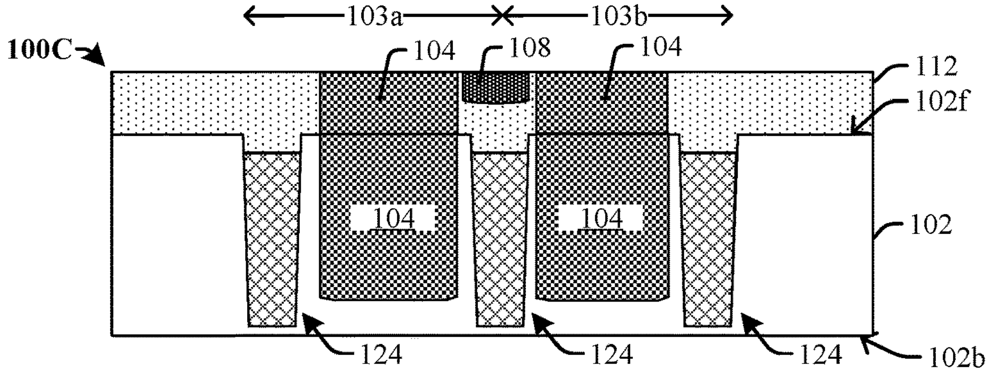
Figure 1D:
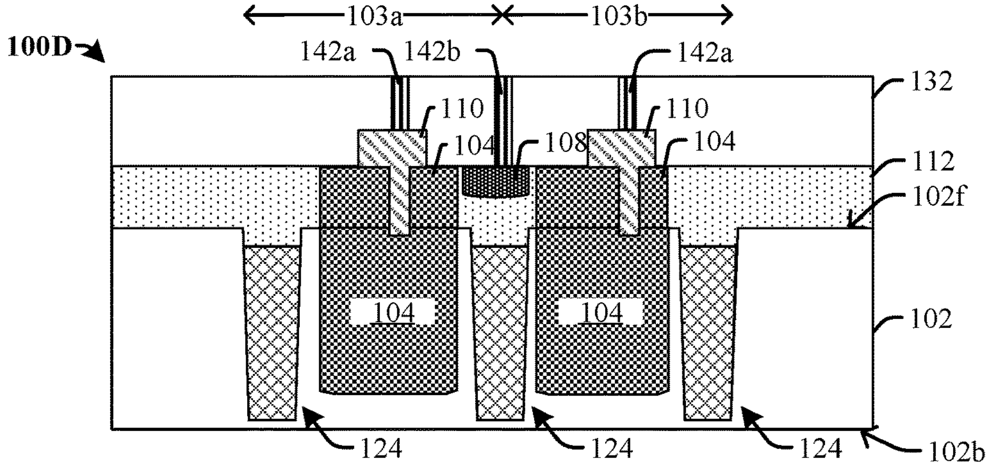

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

An image sensor includes a plurality of pixel regions arranged in an array. Each of the plurality of pixel regions may comprise a photodiode configured to detect incident light and convert the incident light to charge carriers. A transfer gate is configured to control the flow of the converted charge carriers to a floating diffusion (FD) node. The FD node is a capacitor-like structure that collects and stores charge carriers generated by the photodiode. The charge carriers stored in the FD node is then converted into a voltage signal by a readout circuitry (e.g., a plurality of transistors including a reset transistor, a source follower transistor, etc.). As image sensors scale down in size, cross-talk can become a more serious problem due to increased pixel densities and reduced distances between the pixels. In one aspect, as the pixel size shrinks, electrical cross-talk becomes more significant, due to the proximity of parasitic capacitances and resistances between conductive structures, such as adjacent metal contacts or the gate and source/drain regions of a transistor. In another aspect, optical cross-talk occurs when light leaks from one pixel to another due to diffraction, reflection, or scattering. As the pixel size decreases, the amount of light that can be captured by each pixel also decreases, which can increase the likelihood of optical cross-talk. Both electrical and optical cross-talk can degrade the image quality.

Frontside deep trench isolation (FDTI) and backside deep trench isolation (BDTI) are two isolation techniques used to provide for separation among the pixels, in order to reduce cross-talk in CMOS image sensors. An image sensor includes a frontside including active areas of pixels and readout circuitry disposed thereon and a backside on the other side of the active area opposite to the readout circuitry. The FDTI involves creating a deep trench from the frontside of the image sensor between the active areas of the pixels, which is then filled with isolation material. The BDTI, on the other hand, involves creating a deep trench from the backside of the image sensor, which is then filled with isolation material. The BDTI is formed after frontside device procedures and handling wafer bonding. Thus, the BDTI formation may have overlap control issues for front pattern alignments because of wafer thickness and bending caused by the bonding. In addition, the BDTI may cause additional device downgrades and even failure since it may introduce additional stress and chemicals after completing the frontside device procedures. Meanwhile, the FDTI occupies surface area that would otherwise be silicon surface area that can be used for active area or for transfer and readout transistors. As discussed above, as scaling down continues, the problem of FDTI is more significant due to the proximity of pixels. For example, for some shared pixel layouts, FD nodes for a group of pixels may be arranged close to one another, and metal contacts and/or metal routing for the FD nodes are causing significant parasitic capacitance issues.

In view of the above, some embodiments of the present disclosure relate to an improved method to form an image sensor including forming a cap layer over a FDTI structure and forming a FD node within the cap layer overlying the FDTI structure, and an associated image sensor device. Specifically, in some embodiments, a FDTI trench is formed from a frontside of a substrate between a first pixel region and a second pixel region adjacent to the first pixel region and then filled to form a FDTI structure. A cap layer is formed over the FDTI structure and overlying the first pixel region and the second pixel region of the substrate. A first photodiode is formed in the first pixel region and a second photodiode is formed in the second pixel region. A FD node is formed within the cap layer between the first pixel region and the second pixel region overlying the FDTI structure. The FD node may be shared by a group of pixel regions, rather than having an individual FD node for each of the pixels, such that fewer metal contacts are needed and thus parasitic capacitance issues of proximity metal contacts is reduced. In addition, by forming the cap layer and forming the shared FD node within the cap layer overlying the FDTI structure, the surface area for active devices is expanded, and thus pixel areas and distance between adjacent gates are increased. As a result, the image sensor would achieve less noise, better image quality, and an increased dynamic range to capture a wider range of light levels from low light conditions to brightest highlights without losing detail.

FIGS. 1A-1D illustrate a series of cross-sectional views 100A-100D of some embodiments of a method of forming an image sensor. As shown in the cross-sectional view 100A of FIG. 1A, a FDTI structure 124 is formed from a frontside 102*f* of a substrate 102 opposite to a backside 102*b*. The FDTI structure 124 may be formed by performing an etch to form a deep trench followed by filling the deep trench by an isolation material. The isolation material may comprise a stack of dielectric and metal layers. As shown in the cross-sectional view 100B of FIG. 1B, in some embodiments, a cap layer 112 is formed over the FDTI structure 124, after forming the FDTI structure 124 and prior to forming doping areas for active devices on the cap layer 112. As shown in the cross-sectional view 100C of FIG. 1C, the doping areas are formed on the cap layer 112. The doping areas may include photodiodes 104, a FD node 108, and source/drain regions of other pixel devices, for example. In some embodiments, the FD node 108 is shared by a group of pixel regions such as pixel regions 103*a*, 103*b* in FIGS. 1A-1D. As shown in the cross-sectional view 100D of FIG. 1D, in some embodiments, a transfer gate 110 may respectively be formed between the photodiode 104 and the FD node 108. The transfer gate 110 is configured to control current flow between the photodiode 104 and the FD node 108. The transfer gate 110 may comprise a gate electrode and a gate dielectric that are disposed along the frontside 102*f* of the substrate 102. An inter-layer dielectric (ILD) layer 132 may be formed over the substrate 202 and the transfer gate 110. Conductive contacts 142 such as gate contact 142*a* and FD node contact 142*b* and metal interconnect layers (not shown) may be subsequently formed through the ILD layer 132 for the transfer gate 110 and the FD node 108. By forming the cap layer 112 over the FDTI structure 124 and forming the doping areas within the cap layer 112 including the FD node 108 overlying the FDTI structure 124, the surface area for active devices is expanded, and thus pixel areas and distances between adjacent transfer gates 110 are increased. Also, by forming the FD node 108 separated from the FDTI structure 124 by the cap layer 112 and shared by a group of pixels, parasitic capacitance caused by proximate FD node contacts for neighboring pixels is reduced or avoided.

Figure 2A:
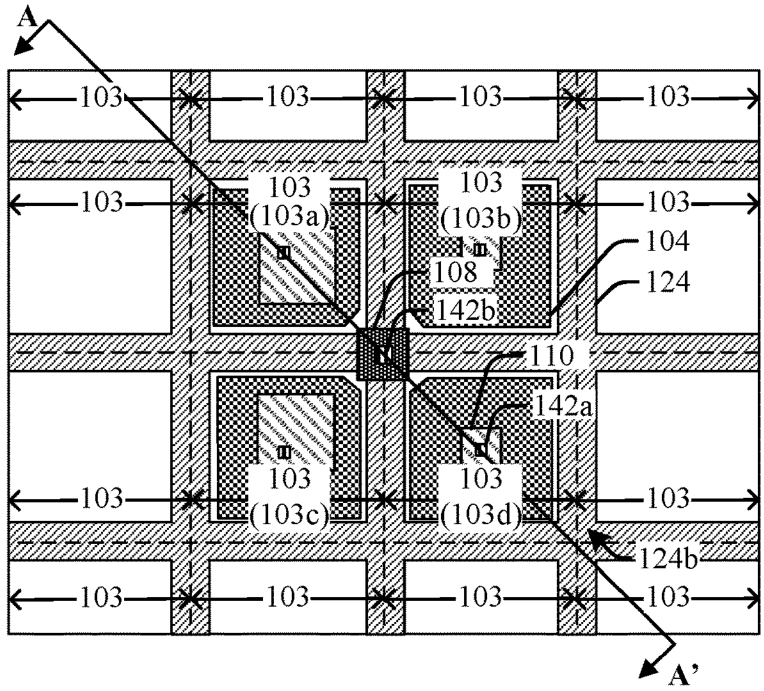
FIGS. 2A-2B illustrate top and cross-sectional views of some embodiments of an image sensor having a plurality of pixel regions separated by a FDTI structure and a shared FD node overlying the FDTI structure.
Figure 2B:
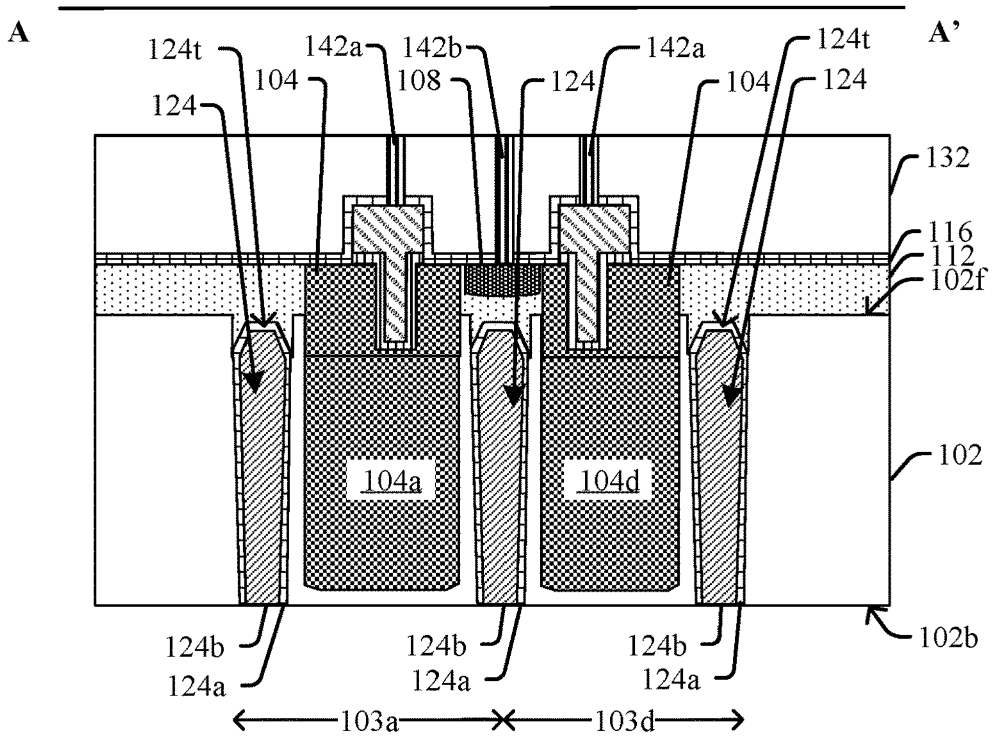
Figure 3:
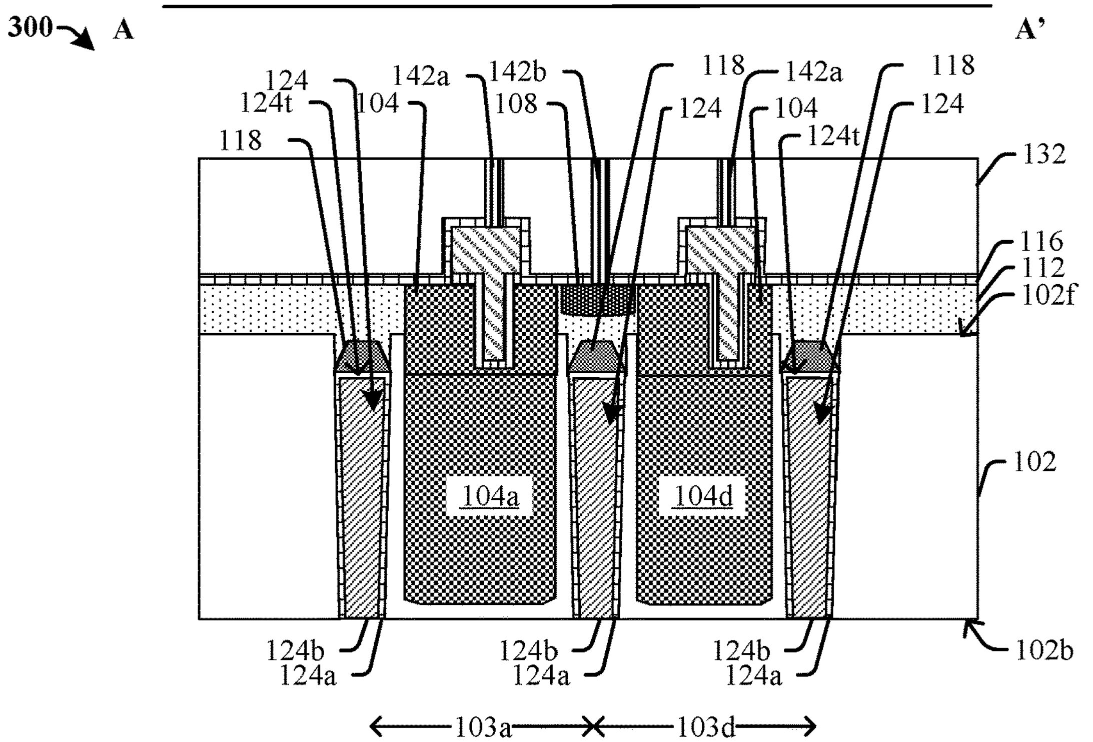
FIGS. 3-4 illustrate cross-sectional views of some additional embodiments of an image sensor having an array of pixel regions separated by a FDTI structure and a shared FD node overlying the FDTI structure.
Figure 4:
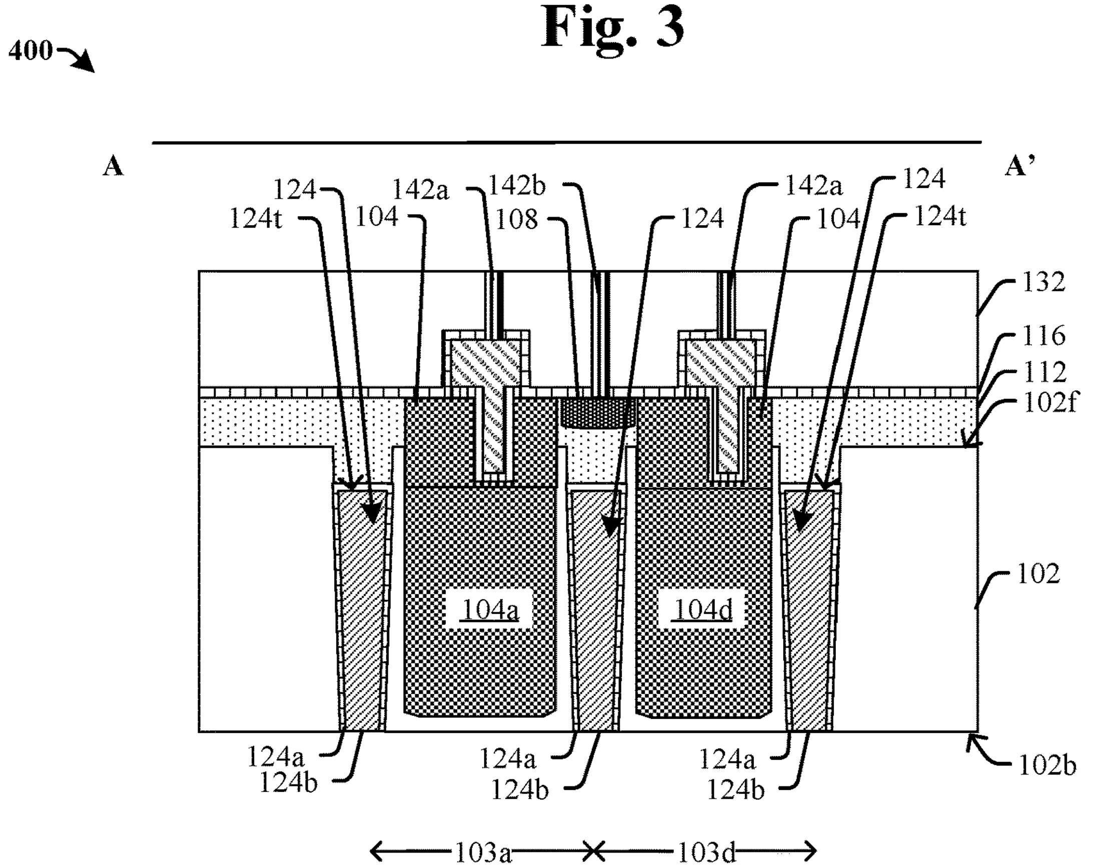

FIGS. 2A-2B illustrate a top view 200A and a cross-sectional view 200B of some embodiments of an image sensor having a plurality of pixel regions 103 separated and isolated by a FDTI structure 124. FIGS. 3-4 illustrate cross-sectional views 300, 400 of some additional embodiments of the image sensor with FDTI structure 124 disposed in the substrate 102 and the shared FD node 108 overlying the FDTI structure 124. The FDTI structure 124 may have different shapes as a result of various formation procedures as shown by FIGS. 3-4. The cross-sectional views 200B, 300, 400 of FIG. 2B, 300, 400 may be taken along line A-A' in FIG. 2A.

As shown in the top view 200A of FIG. 2A, the FDTI structure 124 separates pixel regions 103 of the image sensor. The FDTI structure 124 is configured to provide for isolation of the neighboring pixel regions. In some embodiments, a FD node 108 may be disposed at a crossroad of a group of pixel regions 103*a*-103*d* overlying the FDTI structure 124. The FD node 108 is of a first doping type, for example, an n-type. The group of pixel regions 103*a*-103*d* may be coupled to one same integral FD node, the FD node 108. Although a group of four pixel regions 103*a*-103*d* are illustrated in the figures and described in the specification as sharing a FD node, it is appreciated that a different amount of pixel regions can be designed to share the FD node. A same pattern or multiple different patterns can be repeated to constitute a suitable number of pixel regions arranged for the image sensor.

In some embodiments, each pixel region 103 of the group of pixel regions 103*a*-103*d* comprises a transfer gate 110 and a photodiode 104. The transfer gate 110 is configured to control current flow between the photodiode 104 and the FD node 108. The transfer gate 110 may comprise a gate electrode and a gate dielectric that are disposed along a frontside 102*f* of the substrate 102. The transfer gate 110 may vertically extend in the substrate 202 for better control of the current flow. The gate electrode may comprise, for example, doped polysilicon, a conductive metal (e.g., aluminum), or the like. The gate dielectric may comprise a high-k dielectric, an oxide (e.g., such as silicon dioxide), or the like. The photodiodes 104 are disposed within respective pixel regions 103. The photodiodes 104 are of the first doping type, for example, an n-type.

As shown in FIGS. 2B and 3-4, for example, the substrate 102 has a first pixel region 103*a* and a second pixel region 103*d* adjacent to the first pixel region 103*a*. The substrate 102 may comprise any type of semiconductor body (e.g., silicon/CMOS bulk, SiGe, etc.) such as a semiconductor wafer or one or more die on a wafer, as well as any other type of semiconductor and/or epitaxial layers formed thereon and/or otherwise associated therewith. The substrate 102 may be prepared with a second doping type (e.g. p-type), by a blanket implant or a grading epitaxial growth process, for example.

In some embodiments, a cap layer 112 is disposed over a frontside 102*f* of the substrate 102. The cap layer 112 may be disposed blanketly across the pixel regions 103 of the image sensor. In some embodiments, the cap layer 112 is of the same material as the substrate 102. As an example, the cap layer 112 may be or be comprised of polysilicon.

In some embodiments, a first photodiode 104*a* is disposed in the first pixel region 103*a*, and a second photodiode 104*d* is disposed in the second pixel region 103*d* adjacent to the first pixel region 103*a*. The first photodiode 104*a* and the second photodiode 104*d* are of a first doping type, for example, an n-type. The first photodiode 104*a* and the second photodiode 104*d* extend from the cap layer 112 into the substrate 102. The FDTI structure 124 is disposed between the first pixel region 103*a* and the second pixel region 103*d* and separating the first photodiode 104*a* and the second photodiode 104*d*. In some embodiments, the FDTI structure 124 has a tilted sidewall with a smaller width at a bottom side closer to the backside 102*b* of the substrate 102 and a greater width at a top side 124*t* closer to the frontside 102*f* of the substrate 102. A tilting range of the FDTI structure 124 can range from a few degrees to as much as 45 degrees or more. The FDTI structure 124 may have the width monotonically increasing from the bottom side closer or aligned to the backside 102*b* of the substrate 102 to the top side 124*t* closer to the frontside 102*f* of the substrate 102.

As shown by FIG. 2B for example, in some embodiments, the FDTI structure 124 may be disposed through the substrate 102 and may have a full depth of the substrate 102. Having the FDTI structure 124 extended through the substrate 102, an optimal optical isolation between neighboring pixel regions 103*a*, 103*d* is provided. Also shown by FIG. 2B for example, in some embodiments, the top side 124*t* of the FDTI structure 124 is conical-shaped. As shown by FIG. 3 or FIG. 4 for example, in some alternative embodiments, the top side 124*t* of the FDTI structure 124 is planar-shaped. Also as shown by FIG. 3 or FIG. 4 for example, in some embodiments, the top side 124*t* of the FDTI structure 124 may be recessed back from the frontside 102*f* of the substrate 102. The FDTI structure 124 may extend from a backside 102*b* of the substrate 102 to a position within the substrate 102. As shown by FIG. 3 for example, in some embodiments, a cap-shaped stop layer 118 can be disposed between the FDTI structure 124 and the cap layer 112. The cap-shaped stop layer 118 may be disposed on the planar-shaped top side 124*t* of the FDTI structure 124. The top side 124*t* of the FDTI structure 124 may be fully covered by the cap layer 112.

The FD node 108 of the first doping type, for example, the n-type, is disposed within the cap layer 112 and between the first photodiode 104*a* and the second photodiode 104*d*. The first pixel region 103*a* and second pixel region 103*d* may share the FD node 108. In some embodiments, the FD node 108 is spaced apart from the FDTI structure 124 by the cap layer 112. A ratio of thicknesses of the cap layer 112 to the FDTI structure 124 may be in a range of from about 0.1 to about 0.4. As an example, a depth of the FDTI structure 124 may be in a range of from about 2 μm and about 10 μm. A width of the FDTI structure 124 may be in a range of between from about 40 nm to about 400 nm, or in a range of from about 100 nm to about 150 nm. The cap layer 112 may have a thickness in a range of between about 2000 Å to about 4000 Å. The FD node 108 may have a thickness in a range of between about 500 Å to about 1000 Å. By having the cap layer 112 sufficiently thick, e.g., greater than 0.1 times of the thickness of FDTI structure 124, or greater than 2000 Å, the FD node 108 is sufficiently separated from the FDTI structure 124, such that the FD node 108 can be an integral component shared by the first pixel region 103*a* and second pixel region 103*d* without being interrupted by the FDTI structure 124. By having the cap layer 112 sufficiently thin, e.g., smaller than 0.4 times of the thickness of FDTI structure 124, or smaller than 4000 Å, the top side 124*t* of the FDTI structure 124 is closer to a top of the first photodiode 104*a* and the second photodiode 104*d*, such that the first pixel region 103*a* and second pixel region 103*d* are sufficiently isolated.

In some embodiments, though not shown in the figures, an anti-reflective layer and color filters can be disposed on the backside 102*b* of the substrate 102 corresponding to the pixel regions 103*a*, 103*d*. The color filter is configured to allow for the transmission of radiation having a specific range of wavelength while blocking light of wavelengths outside of the specified range. A color filter isolation structure, such as a composite grid, may be formed separating the color filters for isolation purpose. In addition, micro-lenses may be formed over the color filters.

During operation, incident radiation pass through the micro-lenses and the color filters to hit the backside 102*b* of the substrate 102 and passes from the backside 102*b* of the substrate 102 to the photodiode 104. The photodiode 104 is configured to convert the incident radiation (e.g., photons) into an electric signal (i.e., to generate electron-hole pairs from the incident radiation). The FDTI structure 124 isolates the pixel regions 103*a*, 103*d* while still prevents leakage of the electrical signal from the FD node 108 by having the FDTI structure 124 overlying and spaced apart from the FD node 108.

FIGS. 5-12 illustrate cross-sectional views of some embodiments of a method of forming an image sensor having a FDTI structure and a shared FD node overlying the FDTI structure. Although FIGS. 5-12 are described in relation to a method, it will be appreciated that the structures disclosed in FIGS. 5-12 are not limited to such a method, but instead may stand alone as structures independent of the method.

Figure 5:
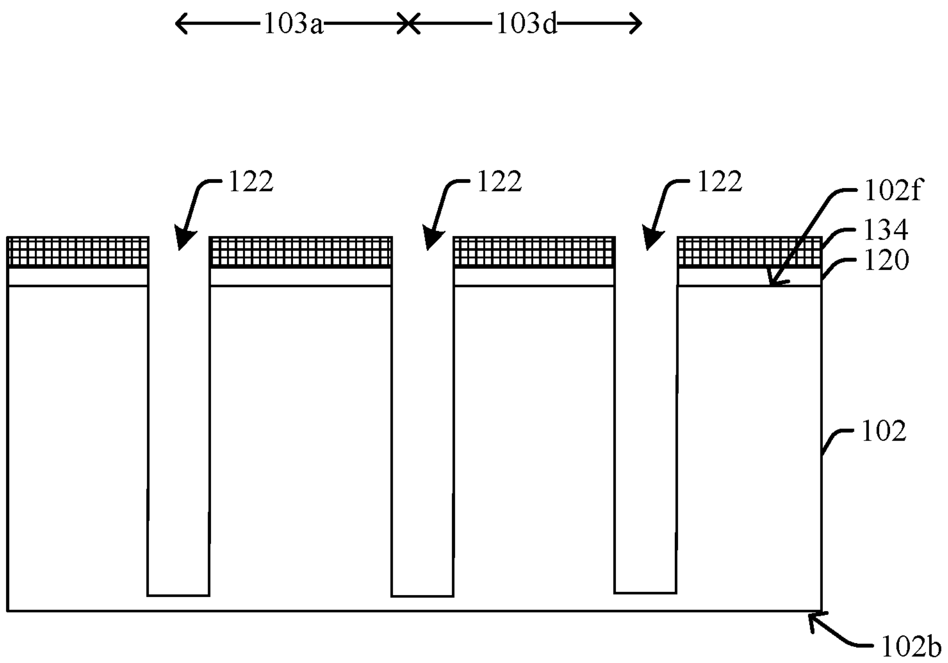
FIGS. 5-12 illustrate a series of cross-sectional views of some embodiments of a method of forming an image sensor having a plurality of pixel regions separated from one another by a FDTI structure and a shared FD node overlying the FDTI structure.

As shown in FIG. 5, a FDTI trench 122 is formed from a frontside 102*f* of a substrate 102 between a first pixel region 103*a* and a second pixel region 103*d* adjacent to the first pixel region 103*a*. The FDTI trench 122 may also be formed at a peripheral region of the first pixel region 103*a* and the second pixel region 103*d*. In some embodiments, the FDTI trench 122 may have a width monotonically increasing from a bottom side closer to the backside 102*b* of the substrate 102 to a top side closer to the frontside 102*f* of the substrate 102. In some embodiments, a hard mask 120 may be formed over the frontside 102*f* of the substrate 102. The hard mask 120 may be formed by one or more deposition or spin-on processes of various polymer, dielectric, and/or metal materials. An example hard mask 120 may comprise a tri-layer structure including a carbon-based hard mask, a silicon contained hard mask and a photoresist stacked from bottom to top.

The hard mask 120 is subsequently patterned to form the FDTI trench 122 separating the first pixel region 103*a* and the second pixel region 103*d*. The hard mask 120 can be patterned by a photolithography process with a photoresist layer 134 patterned, followed by an etching process to etch the hard mask 120 according to the patterned photoresist layer 134. In various embodiments, the etch may comprise a dry etching process having an etching chemistry comprising a fluorine species (e.g., $CF_4$, $CHF_3$, $C_4F_8$, etc.) and/or a wet etchant (e.g., hydrofluoric acid (HF) or Tetramethylammonium hydroxide (TMAH)).

Figure 6:
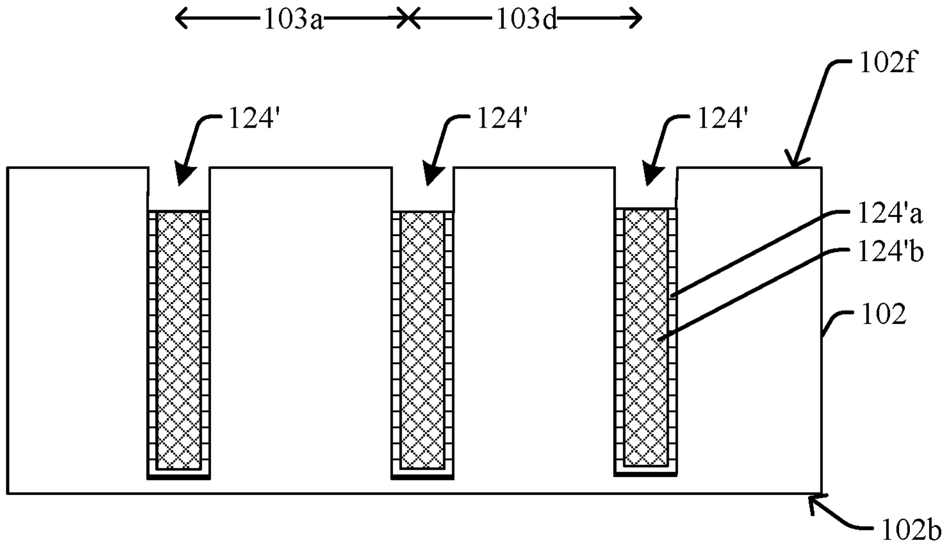

As shown in FIG. 6, in some embodiments, the FDTI trench 122 is filled with an isolation material to form a FDTI structure 124. In some embodiments, a FDTI precursor 124' may be formed by filling a first set of isolation material from the frontside 102*f* of the substrate. After finishing front-side processes, the work piece is flipped, and the FDTI precursor 124' is replaced by a second set of isolation material in order to form a final FDTI structure 124. The isolation material may comprise a stack of dielectric and metal layers. For example, the filling of the isolation material may comprise forming a FDTI liner 142'*a* of dielectric and/or metal lining sidewall and bottom surfaces of the FDTI trench 122 and a main filling column 142'*b* of polysilicon followed by an etching back procedure. A planarization process may be performed to remove an excessive portion of the isolation material above the substrate 102. In addition, in some embodiments, the FDTI precursor 124' is recessed back to a position lower than the frontside 102*f* of the substrate 102, and the FDTI precursor 124' is formed with a first depth smaller than a full depth of the substrate 102. Though an isolation material replacement process is illustrated below with various embodiments, the FDTI structure can also be directly formed from the frontside 102*f* of the substrate 102 without a subsequent isolation material replacement process.

Figure 7:
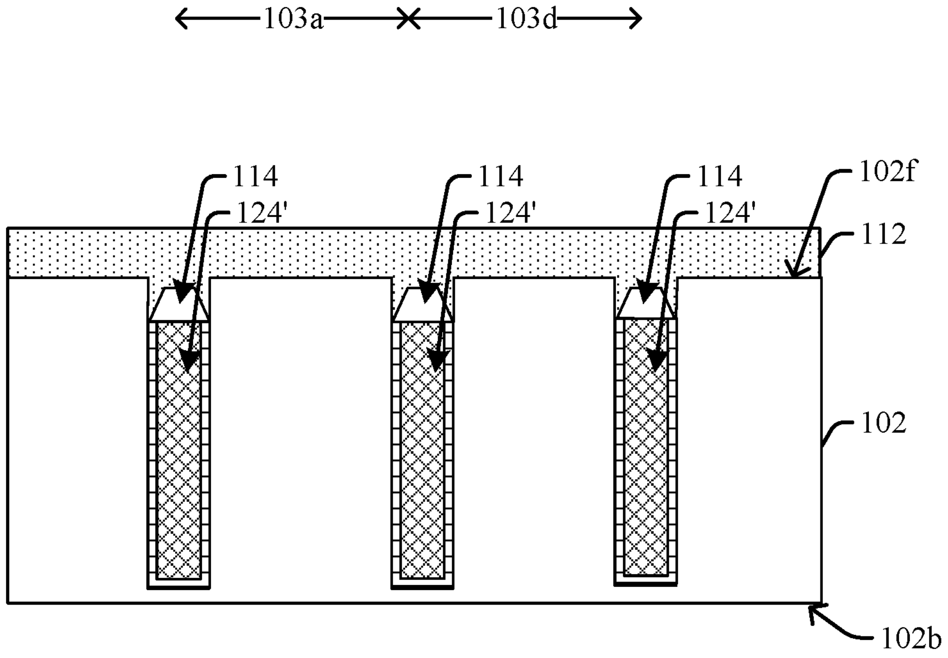

As shown in FIG. 7, in some embodiments, a cap layer 112 is formed over the substrate 102. In some embodiments, the cap layer 112 is formed of the same material as the substrate 102, such that the photodiodes can be formed smoothly from the cap layer 112 to extend into the substrate 102. In some embodiments, the cap layer 112 is formed blanketly across the first pixel region 103*a* and the second pixel region 103*d* of the image sensor. In some embodiments, the cap layer 112 is of the same material as the substrate 102. As an example, the cap layer 112 may be formed of polysilicon that is lightly doped with the second doping type, for example, p-type. In some embodiments, the cap layer 112 has a doping concentration substantially similar as the substrate 102. In some embodiments, the cap layer 112 is formed by a thermal melt procedure or by an epitaxial deposition process.

Also shown in FIG. 7, in some embodiments, the cap layer 112 is formed with voids 114 formed between the cap layer 112 and the FDTI structure 124, or the FDTI precursor 124' if an isolation replacement procedure is performed later in the back-side processes. The voids 114 may have a conical-shape as a result of the growth and merge orientation.

Figure 8:
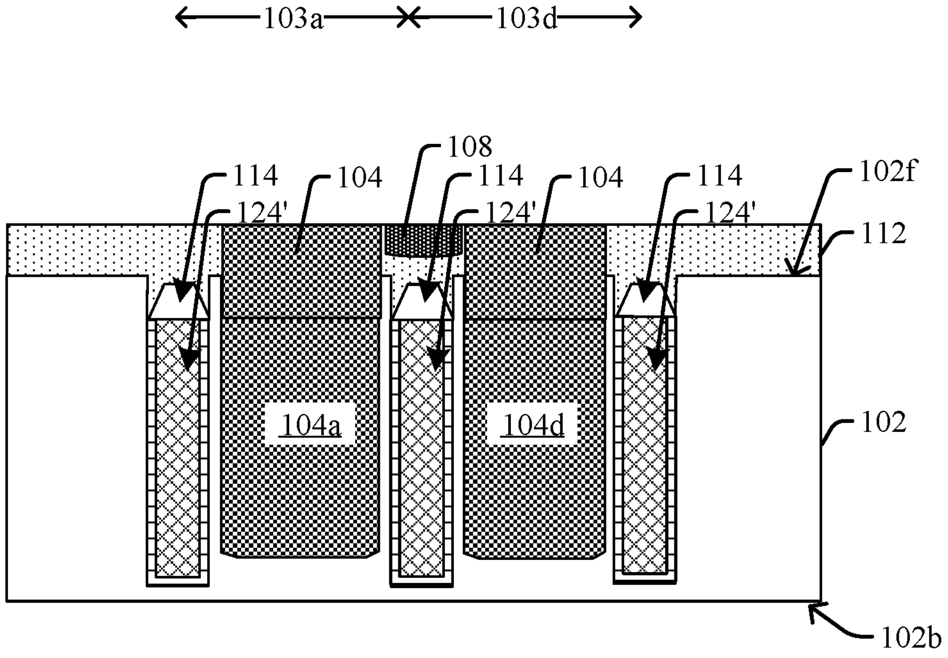
Figure 9:
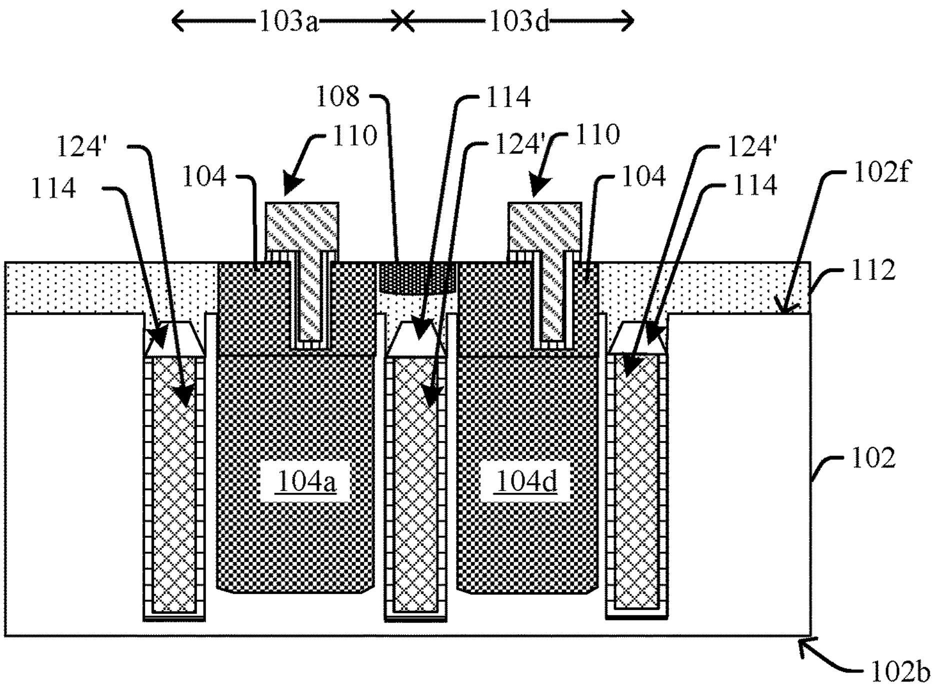
Figure 10:
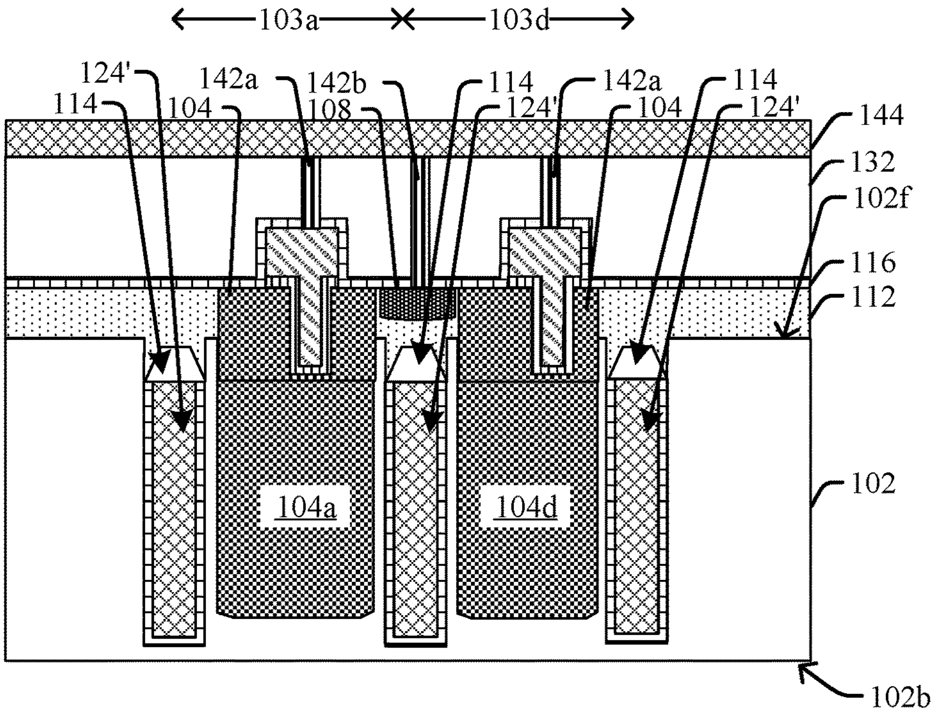

FIGS. 8-10 show some examples to form various doped regions and gate structures after forming the cap layer 112. As shown by more detailed examples below, in some embodiments, a plurality of photodiodes 104 of a first doping type (e.g., n-type) is formed correspondingly within the plurality of pixel regions. A shared FD node 108 of the first doping type may be formed at a crossroad region of a group of pixel regions 103. A plurality of transfer gate 110 may be formed correspondingly between the plurality of photodiodes 104 and the FD node 108.

As shown in FIG. 8, in some embodiments, the photodiode 104 is formed within each of the group of pixel regions 103*a*-103*d* (see FIG. 2A for example). The photodiode 104 may comprise doped regions of the first doping type (e.g., n-type) and may be formed by an implantation process from the cap layer 112 reaching in to the substrate 102 from the frontside 102*f*. The photodiodes 104 may comprise multiple doped layers of different doping concentration, and sidewalls of the multiple doped layers are not necessarily aligned. In addition, the FD node 108 may be formed by doping a portion of the cap layer 112 with the first doping type (e.g., n-type) and a doping concentration greater than the photodiodes 104. In some embodiments, the FD node 108 has a greater doping concentration than the photodiodes 104. The cap layer 112 may separate the FD node 108 from the photodiodes 104 and the substrate 102.

Though not shown in the Figures, in some embodiments, an isolation well may be formed along the frontside 102*f* of the substrate 102 separating the group of pixel regions 103*a*-103*d*. The isolation well may be formed by selectively performing an implantation process of a second doping type (e.g., p-type) into the substrate 102 with a masking layer in place to form doped isolation regions. In some embodiments, a shallow trench isolation (STI) (not shown) may also be formed along the frontside 102*f* of the substrate 102 separating the group of pixel regions 103*a*-103*d*. The STI structure may be formed by selectively etching the substrate from the frontside 102*f* to form a shallow trench and subsequently forming an oxide or other dielectric material within the shallow trench. The isolation well may be formed from the frontside 102*f* of the substrate 102 to a position within the cap layer 112 or all the way through the cap layer 112. The isolation well may be centrally aligned with the STI structure.

As shown in FIG. 9, in some embodiments, a plurality of transfer gates 110 is formed correspondingly between the plurality of photodiodes 104 and the FD node 108. The transfer gate 110 may be formed by depositing a gate dielectric film and a gate electrode film over the substrate 102. The gate dielectric film and the gate electrode film are subsequently patterned to form a gate dielectric layer and a gate electrode. The transfer gate 110 may be a vertical gate extending into the photodiode 104. A gate sidewall spacer (not shown) may be formed on a sidewall of the transfer gate 110. The transfer gate 110 may be formed such that it overlies portions of the photodiode 104 and/or the FD node 108.

As shown in FIG. 10, in some embodiments, an etch stop layer 116 may be formed over the cap layer 112 and the transfer gate 110. In some embodiments, the etch stop layer 116 may comprise a nitride (e.g., silicon nitride), a carbide (e.g., silicon carbide), an oxide (e.g., silicon dioxide), or the like. In some embodiments, the etch stop layer 116 is formed contouring an upper surface of the frontside 102*f* of the substrate 102 and sidewall and upper surfaces of the plurality of transfer gates 110. Then, an inter-layer dielectric (ILD) layer 132 is formed over the etch stop layer 116, and conductive contacts such as gate contact 142*a* and FD node contact 142*b* can be formed through the ILD layer 132 and the etch stop layer 116 coupled to the transfer gate 110 and the FD node 108. The ILD layer 132 can be then bonded to a handle substrate 144 or another functional device (not shown). In some embodiments, the bonding process may use an intermediate bonding oxide layer arranged between the ILD layer 132 and the handle substrate 144. In some embodiments, the bonding process may comprise a fusion bonding process.

Additionally, prior to bonding the handle substrate 144, a metallization stack comprising metal interconnect layers arranged within additional ILD layers can be formed over the ILD layer 132 and electrically coupled to the gate contact 142*a* and the FD node contact 142*b*. In some embodiments, the conductive contacts and the metallization stack may be formed by a damascene process (e.g., a single damascene process or a dual damascene process). Specifically, the ILD layers may be deposited and subsequently etched to form via holes and/or metal trenches. The via holes and/or metal trenches are then filled with a conductive material to form the conductive contacts and the metal interconnect layers. In some embodiments, the ILD layer may be deposited by a physical vapor deposition technique (e.g., PVD, CVD, etc.). The plurality of metal interconnect layers may be formed using a deposition process and/or a plating process (e.g., electroplating, electroless plating, etc.). In various embodiments, the plurality of metal interconnect layers may comprise tungsten, copper, or aluminum-copper, for example.

Figure 11:
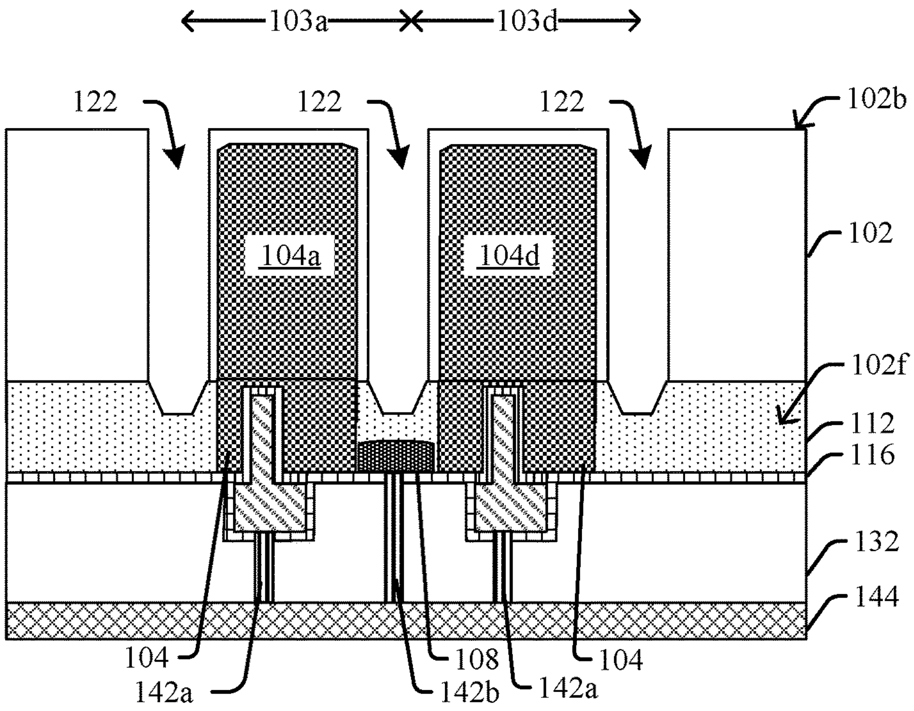
Figure 12:
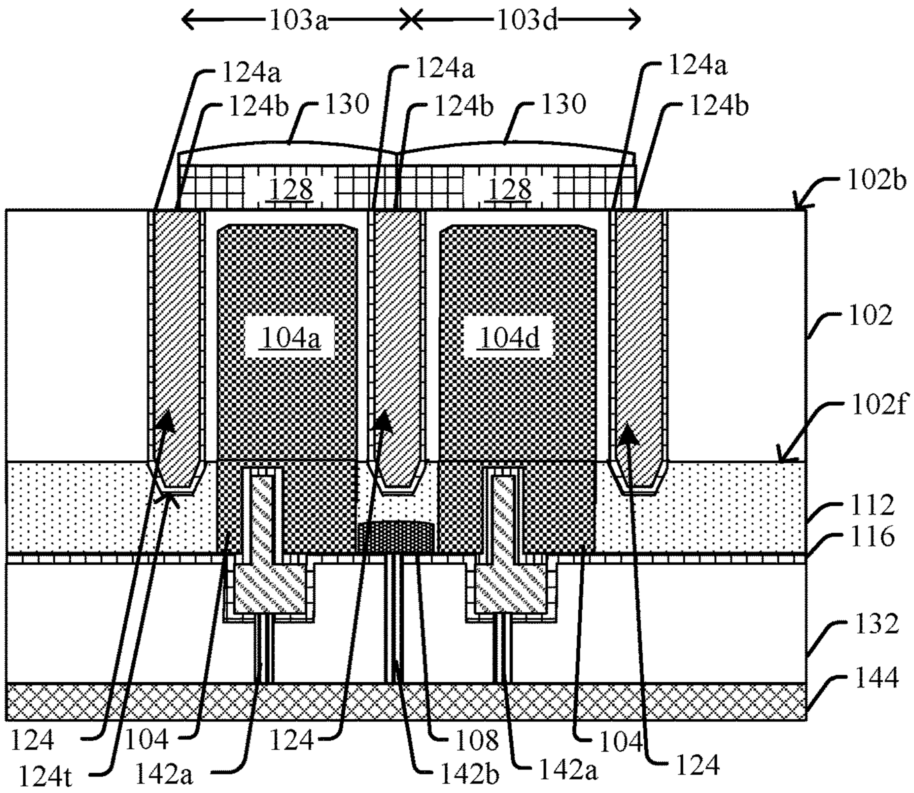
Figure 16:
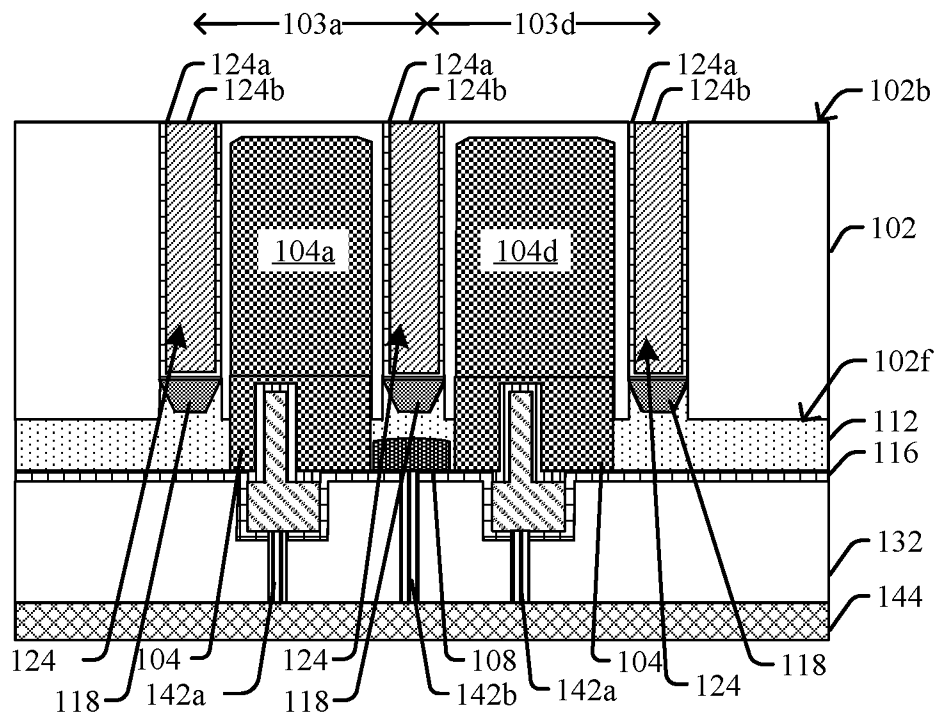

FIGS. 11-12 show some examples of flipping over the substrate 102 for further processing on a backside 102*b* that is opposite to the frontside 102*f*. As shown in FIG. 11, the substrate 102 may be firstly thinned from the backside 102*b* to reduce a thickness of the substrate 102. The substrate 102 may be thinned to expose the FDTI precursor 124' and allow for radiation to pass through the backside 102*b* of the substrate 102 to the photodiode 104. In some embodiments, the substrate 102 may be thinned by etching or mechanical grinding the backside 102*b* of the substrate 102. In some embodiments, the FDTI precursor 124' may be then removed and replaced with different isolation material filled into the FDTI trench 122 to form the FDTI structure 124. As an example, as shown in FIG. 16, a FDTI liner 124*a* of dielectric including high-k dielectric and/or metal, is firstly formed lining sidewall and bottom surface of the FDTI trench 122, followed by forming a main filling column 124*b* of polysilicon. A planarization process is then performed to remove excess isolation material. Since the bottom surface of the FDTI trench 122 may be a conical-shape from the exposed cap layer 112, the replaced FDTI structure 124 may have a conical-shaped top side 124*t* closer to the frontside 102*f* of the substrate 102.

Also shown in FIG. 12, in some embodiments, a plurality of color filters 128 can be subsequently formed over the backside 102*b* of the substrate 102. In some embodiments, the plurality of color filters 128 may be formed individually by forming and patterning respective color filter layers corresponding to the group of pixel regions 103*a*-103*d*. A color filter layer is a material that allows for the transmission of radiation (e.g., light) having a specific range of wavelength while blocking light of wavelengths outside of the specified range. A color filter isolation structure (not shown), such as a composite grid, may be formed separating the color filters 128 for isolation purpose.

In addition, a plurality of micro-lenses 130 may be formed over the plurality of color filters 128. As an example, the plurality of micro-lenses may be formed by depositing a micro-lens material above the plurality of color filters 128 (e.g., by a spin-on method or a deposition process). A micro-lens template having a curved upper surface is patterned above the micro-lens material. In some embodiments, the micro-lens template may comprise a photoresist material exposed using a distributing exposing light dose (e.g., for a negative photoresist more light is exposed at a bottom of the curvature and less light is exposed at a top of the curvature), developed and baked to form a rounding shape. The plurality of micro-lenses is then formed by selectively etching the micro-lens material according to the micro-lens template.

Figure 13:
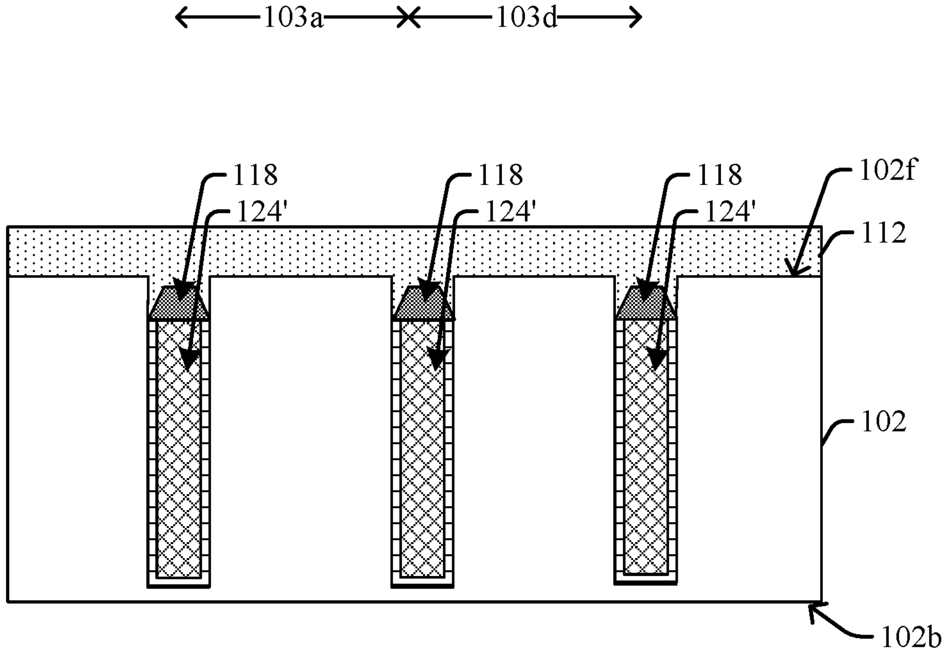
FIGS. 13-16 illustrate a series of cross-sectional views of some additional embodiments of a method of forming an image sensor having a plurality of pixel regions separated from one another by a FDTI structure and a shared FD node overlying the FDTI structure.
Figure 14:
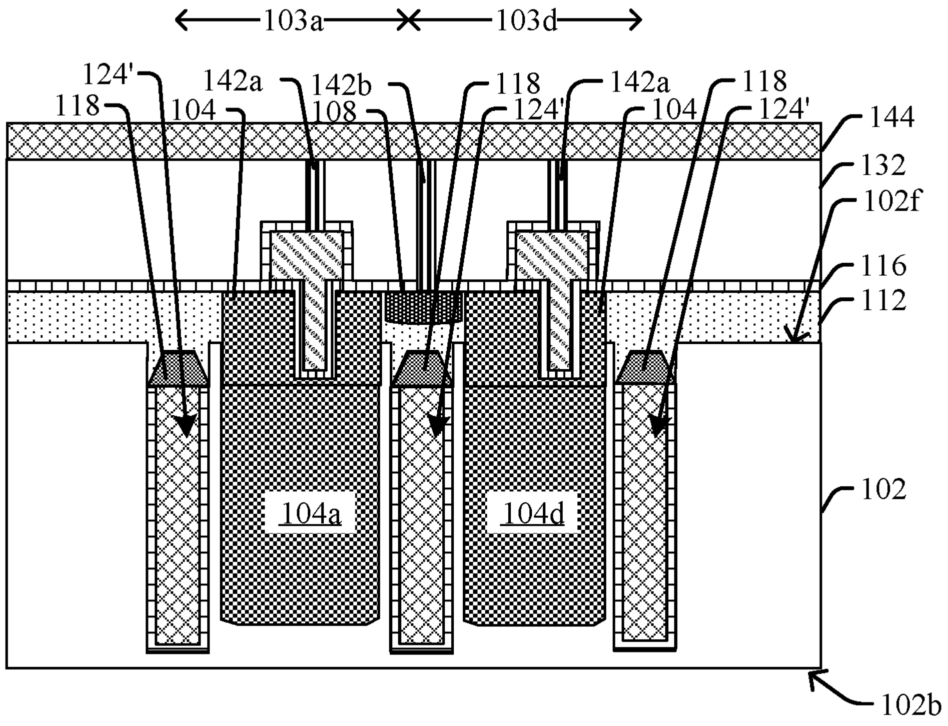
Figure 15:
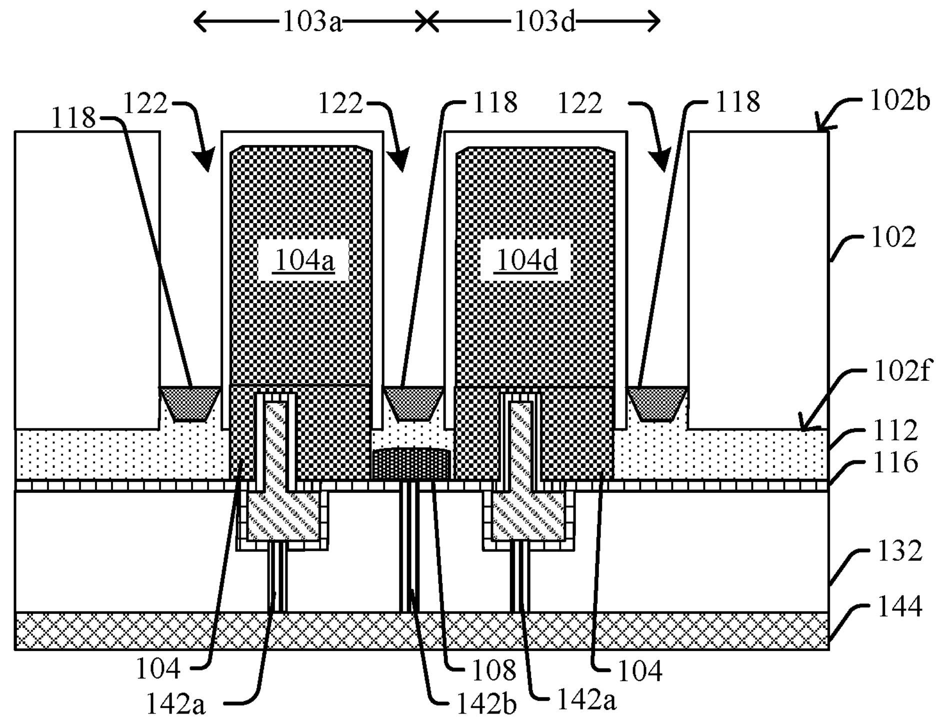

FIGS. 13-16 show an example where alternative to leaving voids when forming the cap layer 112 as shown and discussed above associated with FIGS. 7-12, in some other embodiments, a stop layer 118 can be formed between the cap layer 112 and the FDTI precursor 124'. As shown in FIG. 13, the stop layer 118 may be formed within a remaining upper portion of the FDTI trench 122 and contacting the FDTI precursor 124'. In some embodiments, the stop layer 118 is formed by forming a fill material of dielectric, polysilicon or metal within the remaining upper portion of the FDTI trench 122 and contacting the FDTI precursor 124' followed by a recess etching process to remove excessive material above the first photodiode 104*a* and the second photodiode 104*b*. In some embodiments, the stop layer 118 may be formed with a conical shape by adjusting the recess etching process and/or the subsequent wet cleaning, such that the stop layer 118 can have a top contour matching the voids to be generated from forming the cap layer 112. Remaining fabrication steps can be similar to what is discussed above associated with FIGS. 7-12, where doping areas are formed within the cap layer 112 including forming the first photodiode 104*a* and the second photodiode 104*b* reaching into the substrate 102 from the frontside 102*f* of the substrate 102, as shown in FIG. 14. The work piece may then be flipped to thin down the substrate 102 from the backside 102*b*. In some embodiments, as shown in FIGS. 15-16, the stop layer 118 may not be removed from the FDTI trench 122 when flipping the work piece and replacing isolation material from the backside 102*b* to replace the FDTI precursor 124' with the FDTI structure 124. The FDTI structure 124 may be formed with a planar bottom surface contacting the planar bottom surface of the stop layer 118. As an example, as shown in FIG. 16, a FDTI liner 124*a* of dielectric including high-k dielectric and/or metal, is firstly formed lining sidewall surface of the FDTI trench 122 and the bottom surface of the stop layer 118, followed by forming a main filling column 124*b* of polysilicon. A planarization process is then performed to remove excess isolation material.

Figure 17:
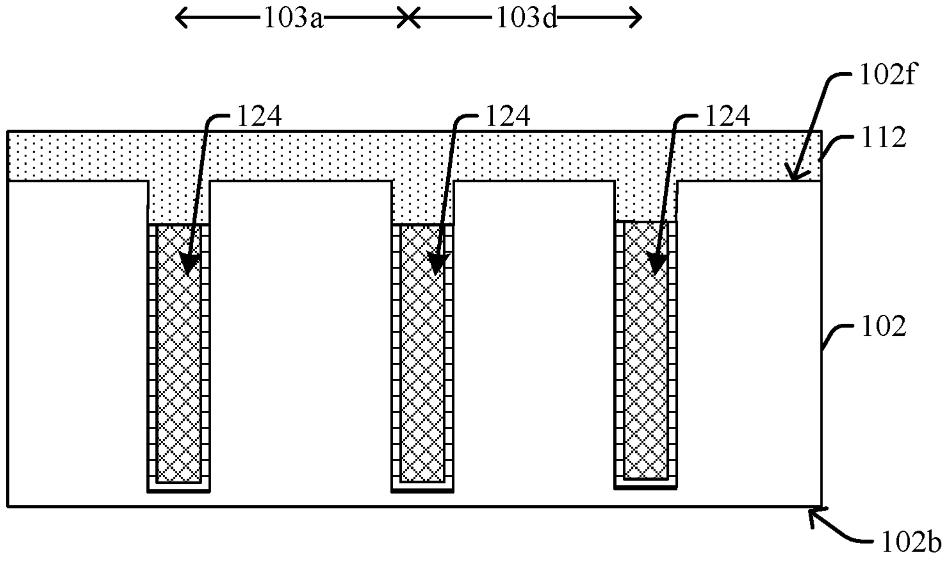
FIGS. 17-20 illustrate a series of cross-sectional views of some additional embodiments of a method of forming an image sensor having a plurality of pixel regions separated from one another by a FDTI structure and a shared FD node overlying the FDTI structure.
Figure 18:
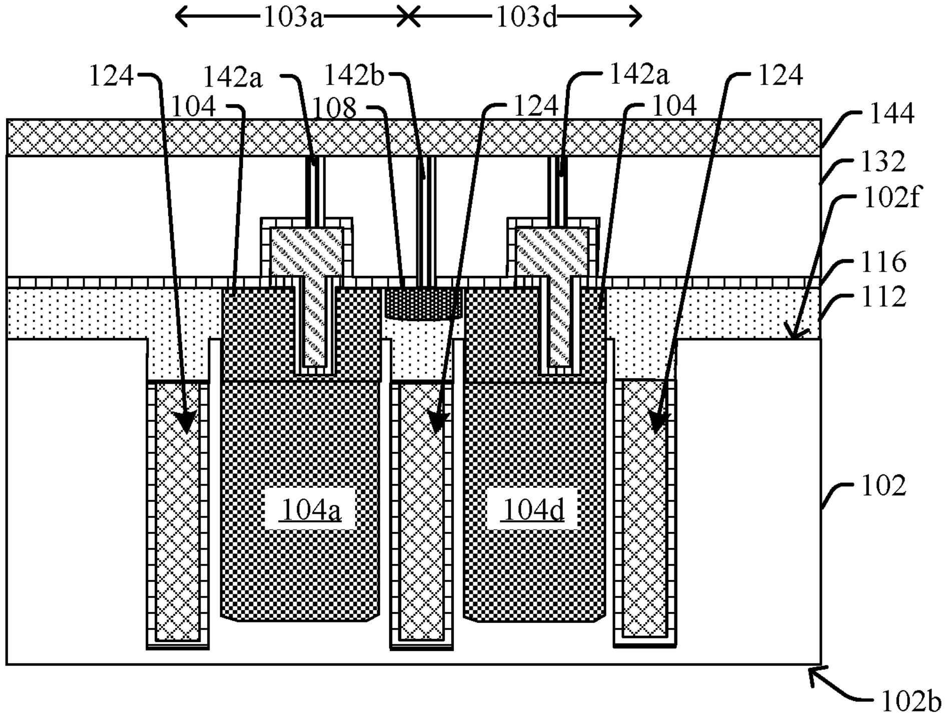
Figure 19:
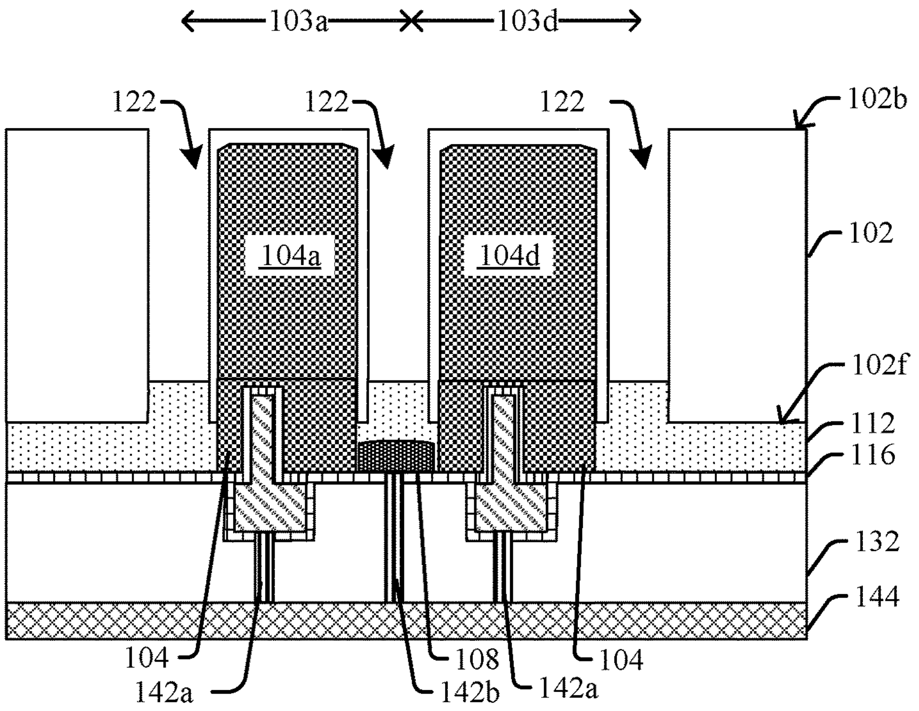
Figure 20:
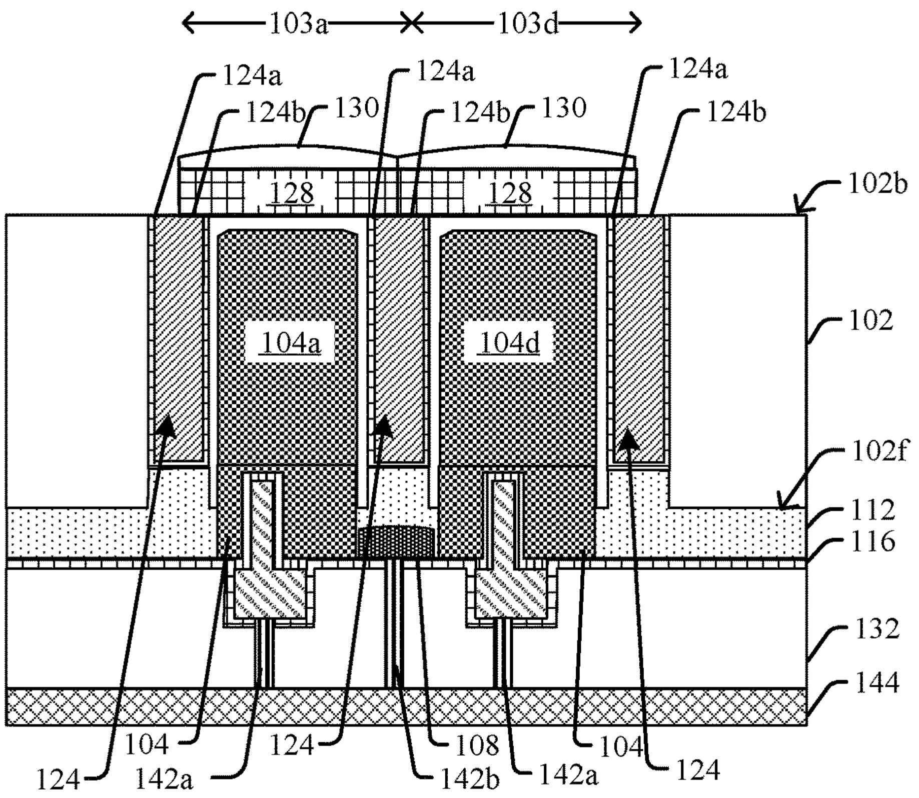

FIGS. 17-20 show an example where alternative to leaving the voids 114 when forming the cap layer 112 as shown and discussed above associated with FIGS. 7-12 or forming the stop layer 118 in the place of the voids caused by forming the cap layer 112 as shown and discussed above associated with FIGS. 13-16, in some other embodiments, the cap layer 112 can be formed to fully fill the remaining upper portion of the FDTI trench 122 and contacting the recessed FDTI structure 124. By adjusting forming parameters, such as melt temperature/time, epitaxy pressure/growth rate, and/or final thermal anneal, the cap layer 112 can be formed with a planar bottom surface covering the entire top surface of the FDTI precursor 124', as shown in FIG. 17. Remaining fabrication steps are similar to what is discussed above associated with FIGS. 7-12, where doping areas are formed within the cap layer 112 including forming the first photodiode 104*a* and the second photodiode 104*b* reaching into the substrate 102 from the frontside 102*f* of the substrate 102, as shown in FIG. 18. The work piece may then be flipped to thin down the substrate 102 from the backside 102*b*. In some embodiments, as shown in FIGS. 19-20, when flipping the work piece and replacing isolation material from the backside 102*b* to replace the FDTI precursor 124' with the FDTI structure 124, the FDTI structure 124 may be formed with a planar bottom surface contacting the planar bottom surface of the cap layer 112. As an example, as shown in FIG. 20, a FDTI liner 124*a* of dielectric including high-k dielectric and/or metal, is firstly formed lining sidewall surface of the FDTI trench 122 and the bottom surface of the cap layer 112, followed by forming a main filling column 124*b* of polysilicon. A planarization process is then performed to remove excess isolation material.

Figure 21:
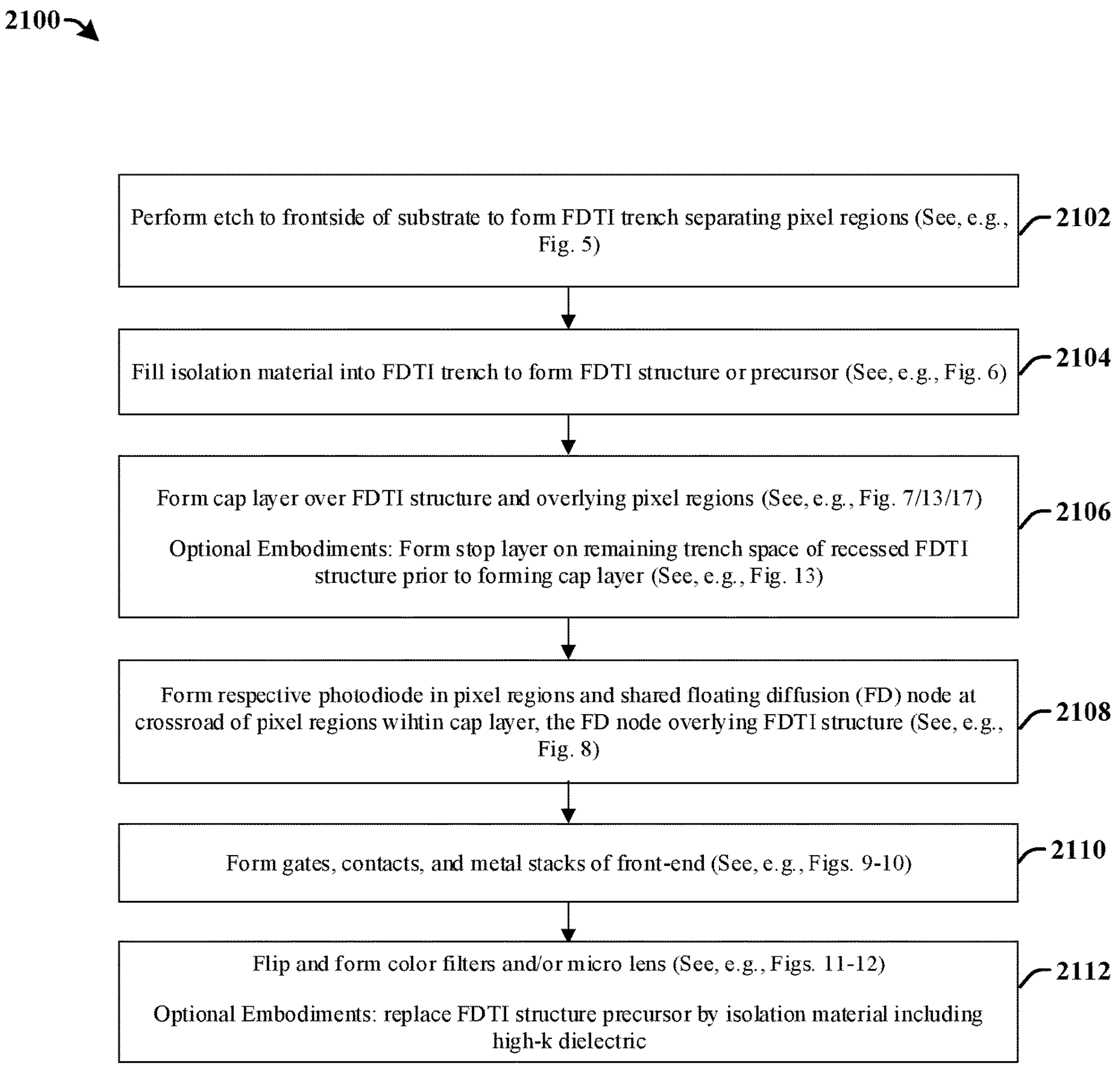
FIG. 21 illustrates a flow diagram of some embodiments of a method of forming an image sensor having a plurality of pixel regions separated from one another by a FDTI structure and a shared FD node overlying the FDTI structure.

FIG. 21 illustrates a flow diagram of some embodiments of a method 2100 of forming an image sensor having a plurality of pixel regions separated from one another by a FDTI structure and a shared FD node overlying the FDTI structure.

While method 2100 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At act 2102, an FDTI trench is formed on a frontside of a substrate separating pixel regions. The FDTI trench may also be formed at peripheral regions of the pixel regions. In some embodiments, the FDTI trench may have a width monotonically increasing from a bottom side closer to the backside of the substrate to a top side closer to the frontside of the substrate. See, for example, FIG. 5.

At act 2104, the FDTI trench is filled with an isolation material. The isolation material may comprise a stack of dielectric and metal layers. For example, the filling of the isolation material may comprise forming a FDTI liner of dielectric and/or metal lining sidewall and bottom surfaces of the FDTI trench and a main filling column of polysilicon followed by an etching back procedure. A planarization process may be performed to remove an excessive portion of the isolation material above the substrate. In addition, in some embodiments, the isolation material is recessed back to a position lower than the frontside of the substrate. See, for example, FIG. 6.

At act 2106, a cap layer is formed over the FDTI structure and overlying the pixel regions. The cap layer may be formed of the same material as the substrate such that the photodiodes can be formed smoothly from the cap layer to extend into the substrate. In some embodiments, the cap layer is formed blanketly across the pixel regions of the image sensor. In some embodiments, the cap layer is formed by a thermal melt procedure or by an epitaxial deposition process. In some embodiments, the cap layer is formed with voids between the cap layer and the FDTI structure or the precursor. The voids may have a conical-shape as a result of the growth and merge orientation. See, for example, FIG. 7.

In some alternative embodiments, the cap layer 112 can be formed to fully fill the remaining upper portion of the FDTI trench and contacting the isolation material. By adjusting forming parameters, such as melt temperature/time, epitaxy pressure/growth rate, and/or final thermal anneal, the cap layer can be formed with a planar bottom surface covering the entire top surface of the recessed isolation material. See, for example, FIG. 17.

Further alternative to leaving the voids between the cap layer and the isolation material when forming the cap layer or forming the cap layer without voids above the isolation material by adjusting process parameters as discussed above, in some embodiments, a stop layer is formed within the remaining space of the FDTI trench. The stop layer may be formed by forming a fill material of dielectric, polysilicon or metal within the remaining upper portion of the FDTI trench followed by a recess etching process to remove excessive material above the substrate. In some embodiments, the stop layer may be formed with a conical shape by adjusting the recess etching process and/or the subsequent wet cleaning, such that the stop layer can have a top contour matching the voids to be generated from forming the cap layer. See, for example, FIG. 13.

At act 2108, the frontside of the substrate is prepared for forming an image sensor. Specifically, a plurality of photodiodes of a first doping type may be formed in the substrate respectively within a plurality of pixel regions arranged in rows and columns from a top view. A floating diffusion (FD) node of the first doping type may be formed from the frontside of the substrate at a crossroad of the plurality of pixel regions. The FD node may be formed by doping a portion of the cap layer with a doping concentration greater than the photodiodes. The FD node may be separated from the photodiodes by the cap layer. See, for example, FIG. 8.

At act 2110, a plurality of transfer gates may be formed correspondingly between the plurality of photodiodes and the FD node. The plurality of transfer gates is formed correspondingly between the plurality of photodiodes and the FD node. The transfer gates may be formed by depositing a gate dielectric film and a gate electrode film over the substrate. The gate dielectric film and the gate electrode film are subsequently patterned to form a gate dielectric layer and a gate electrode. An ILD layer is formed over the transfer gates, and conductive contacts such as gate contacts and FD node contacts can be formed through the ILD layer. The ILD layer can be then bonded to a handle substrate or another functional device (not shown). In some embodiments, the bonding process may use an intermediate bonding oxide layer arranged between the ILD layer and the handle substrate. In some embodiments, the bonding process may comprise a fusion bonding process. In some embodiments, prior to bonding, a metallization stack comprising metal interconnect layers arranged within additional ILD layers can be formed over the ILD layer and electrically coupled to the gate contacts and the FD node contacts. In some embodiments, the conductive contacts and the metallization stack may be formed by a damascene process (e.g., a single damascene process or a dual damascene process). The transfer gate may be a vertical gate extending into the photodiodes. See, for example, FIGS. 9-10.

At act 2112, the work piece is flipped and a backside of the substrate is prepared. A plurality of color filters and/or micro-lenses may be formed at the backside of the substrate corresponding to the plurality of photodiodes. The substrate may be firstly thinned from the backside of the substrate to reduce a thickness of the substrate. The substrate may be thinned to allow for radiation to pass through the backside of the substrate to the photodiode. In some embodiments, the substrate may be thinned to expose the FDTI precursor, and the FDTI precursor may be then partially or fully removed and replaced with different isolation material filled into the FDTI trench to form the FDTI structure. A planarization process is then performed to remove excess isolation material. See, for example, FIGS. 11-12.

Therefore, the present disclosure relates to a new method of formation and corresponding device structure of an image sensor. The image sensor is formed to have pixel regions surrounded and isolated from one another by a FDTI structure and a FD node disposed at a crossroad of a group of pixels within a cap layer and overlying the FDTI structure.

Accordingly, in some embodiments, the present disclosure relates to a method for forming an image sensor. The method includes forming a frontside deep trench isolation (FDTI) trench from a frontside of a substrate between a first pixel region and a second pixel region adjacent to the first pixel region and filling the FDTI trench to form a FDTI structure with a first depth. The method further includes forming a cap layer over the FDTI structure and overlying the first pixel region and the second pixel region of the substrate. The method further includes forming a first photodiode in the first pixel region and a second photodiode in the second pixel region. The first photodiode and the second photodiode are of a first doping type. The method further includes forming a floating diffusion (FD) node of the first doping type within the cap layer between the first pixel region and the second pixel region. The FD node overlies the FDTI structure.

In other embodiments, the present disclosure relates to a method for forming an image sensor. The method includes forming a frontside deep trench isolation (FDTI) structure from a frontside of a substrate separating a plurality of pixel regions arranged in rows and columns from a top view and forming a cap layer over the FDTI structure and overlying the plurality of pixel regions. The method further includes forming a plurality of photodiodes of a first doping type from the cap layer and extending in the substrate and forming a floating diffusion (FD) node of the first doping type within the cap layer shared by a group of pixel regions within the plurality of pixel regions. The FD node is arranged at a crossroad of the group of pixel regions overlying the FDTI structure.

In yet other embodiments, the present disclosure relates to image sensor including a substrate having a first pixel region and a second pixel region adjacent to the first pixel region. A cap layer is disposed over a frontside of the substrate. A first photodiode and a second photodiode extend from the cap layer into the substrate. The first photodiode is disposed in the first pixel region, and the second photodiode is disposed in the second pixel region. The first photodiode and the second photodiode are of a first doping type. A frontside deep trench isolation (FDTI) structure is disposed between the first pixel region and the second pixel region. A floating diffusion (FD) node of the first doping type is disposed within the cap layer and spaced apart from the FDTI structure by the cap layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming an image sensor, the method comprising:
- forming a frontside deep trench isolation (FDTI) trench from a frontside of a substrate between a first pixel region and a second pixel region adjacent to the first pixel region;
- partially filling the FDTI trench with a FDTI structure to form a FDTI structure with a first depth;
- forming a cap layer in a remaining upper portion of the FDTI trench over the FDTI structure and overlying the first pixel region and the second pixel region of the substrate;
- forming a first photodiode in the first pixel region and a second photodiode in the second pixel region, wherein the first photodiode and the second photodiode are of a first doping type; and
- forming a floating diffusion (FD) node of the first doping type within the cap layer between the first pixel region and the second pixel region, wherein the FD node overlies the FDTI structure.

2. The method of claim 1, wherein the FD node is formed to be spaced apart from the FDTI structure by the cap layer.

3. The method of claim 1, wherein the cap layer is formed contacting an upper surface of the FDTI structure.

4. The method of claim 1, wherein the cap layer is formed with a cap-shaped stop layer formed between the cap layer and the FDTI structure.

5. The method of claim 1, further comprising:
- forming a stop layer between the cap layer and the FDTI structure in a remaining upper portion of the FDTI trench contacting the FDTI structure.

6. The method of claim 5, wherein both the cap layer and the stop layer contact the FDTI structure.

7. The method of claim 1, further comprising:
- after forming the cap layer, forming a first gate structure over the first photodiode and a second gate structure over the second photodiode; and
- forming an interlayer dielectric (ILD) layer over the first gate structure and the second gate structure and the cap layer.

8. The method of claim 7, further comprising:
- forming a first gate contact and a second gate contact through the ILD layer and respectively reaching the first gate structure and the second gate structure; and
- forming a FD contact through the ILD layer and reaching the FD node, wherein the FD node is configured to be shared by the first pixel region and the second pixel region.

9. The method of claim 1, further comprising:
- flipping the substrate and performing a thinning down process from a backside of the substrate to expose the FDTI structure; and
- removing and replacing the FDTI structure with a replaced FDTI structure comprising a high-k dielectric liner.

10. The method of claim 1, wherein the cap layer includes polysilicon.

11. A method for forming an image sensor, the method comprising:
- forming a frontside deep trench isolation (FDTI) trench from a frontside of a substrate separating a plurality of pixel regions arranged in rows and columns from a top view;
- filling the FDTI trench followed by a recessing process to form a dummy FDTI structure with a first depth;
- replacing the dummy FDTI structure with a FDTI structure comprising a stack of metal and dielectric layers including a high-k dielectric liner;
- forming a cap layer over the FDTI structure and overlying the plurality of pixel regions;
- forming a plurality of photodiodes of a first doping type from the cap layer and extending in the substrate; and
- forming a floating diffusion (FD) node of the first doping type within the cap layer shared by a group of pixel regions within the plurality of pixel regions, wherein the FD node is arranged at a crossroad of the group of pixel regions overlying the FDTI structure.

12. The method of claim 11, wherein the cap layer is formed by thermal melting or epitaxy with a conical-shaped void formed between the cap layer and the FDTI structure.

13. The method of claim 11, further comprising forming a stop layer with a conical shape between the cap layer and the FDTI structure and in a remaining upper portion of the FDTI trench contacting the FDTI structure.

14. The method of claim 11, further comprising:

forming a plurality of gate structures over the plurality of photodiodes;

forming an interlayer dielectric (ILD) layer over the plurality of gate structures and the cap layer; and forming a single FD contact through the ILD layer and reaching the FD node.

15. The method of claim 11, further comprising forming a stop layer contacting the FDTI structure prior to the formation of the cap layer.

16. The method of claim 11, further comprising forming a plurality of color filters at a backside of the substrate corresponding to the plurality of photodiodes, wherein the plurality of color filters meet the plurality of photodiodes at interfaces overlying the FDTI structure.

17. A method, comprising:

a substrate having a first pixel region and a second pixel region adjacent to the first pixel region;

forming a cap layer over a frontside of a substrate;

forming a first photodiode and a second photodiode extending from the cap layer into the substrate, wherein the first photodiode and the second photodiode are of a first doping type;

forming a stop layer on the cap layer;

forming a frontside deep trench isolation (FDTI) structure between the first photodiode and the second photodiode on the stop layer; and forming a floating diffusion (FD) node of the first doping type within the cap layer and spaced apart from the FDTI structure by the cap layer.

18. The method of claim 17, wherein the FDTI structure is formed with a width monotonically increasing from a backside of the substrate to a position within the substrate.

19. The method of claim 17, wherein the stop layer contacts upper surfaces of the cap layer and the FDTI structure.

20. The method of claim 19, wherein the FDTI structure is formed with a planar-shaped bottom sitting on the stop layer.

* * * * *